(12) United States Patent
Hwang et al.

(10) Patent No.: US 11,923,209 B2
(45) Date of Patent: Mar. 5, 2024

(54) SUBSTRATE PROCESSING APPARATUS AND SUBSTRATE PROCESSING METHOD

(71) Applicant: SAMSUNG ELECTRONICS CO., LTD., Suwon-si (KR)

(72) Inventors: Hyunwoong Hwang, Suwon-si (KR); Chawon Koh, Yongin-si (KR); Seok Heo, Hwaseong-si (KR); Hyunwoo Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/678,233

(22) Filed: Feb. 23, 2022

(65) Prior Publication Data
US 2023/0033040 A1    Feb. 2, 2023

(30) Foreign Application Priority Data
Jul. 27, 2021    (KR) .................... 10-2021-0098360

(51) Int. Cl.
*H01L 21/67* (2006.01)
*H01L 21/687* (2006.01)

(52) U.S. Cl.
CPC .... *H01L 21/67051* (2013.01); *H01L 21/6715* (2013.01); *H01L 21/68764* (2013.01)

(58) Field of Classification Search
CPC ........... H01L 21/67051; H01L 21/6715; H01L 21/68764; B05B 1/14; B08B 3/02
See application file for complete search history.

(56) References Cited

U.S. PATENT DOCUMENTS

| | | | |
|---|---|---|---|
| 8,721,834 B2 | 5/2014 | Koo et al. | |
| 9,355,871 B2 | 5/2016 | Higashijima et al. | |
| 9,470,979 B2 | 10/2016 | Takiguchi et al. | |
| 9,620,394 B2 | 4/2017 | Kishita et al. | |
| 2007/0277930 A1* | 12/2007 | Yokoyama | H01L 21/67051 156/345.31 |
| 2013/0008872 A1* | 1/2013 | Higashuima | H01L 21/6715 156/345.23 |

(Continued)

FOREIGN PATENT DOCUMENTS

JP    2008-117831 A    5/2008
KR    10-0327331 B1    3/2002

*Primary Examiner* — Mikhail Kornakov
*Assistant Examiner* — Emily H Yasharpour
(74) *Attorney, Agent, or Firm* — Fish & Richardson P.C.

(57) ABSTRACT

A substrate processing apparatus includes a substrate support configured to support and rotate a substrate, at least one first lower cleaning nozzle configured to spray a first cleaning liquid on a lower surface of the substrate, at least one second lower cleaning nozzle configured to spray a second cleaning liquid on the lower surface of the substrate, a bowl assembly disposed around the substrate support, the bowl assembly including a cup body providing an annular shaped accommodating space and inner and outer collection portions sequentially arranged in a radial direction in a lower portion of the cup body, an annular shaped discharge guide plate disposed in the receiving space of the bowl assembly under the substrate and extending outwardly from a circumference of the substrate, and a discharge separation plate provided within the receiving space of the bowl assembly to be movable upward and downward.

20 Claims, 16 Drawing Sheets

(56) References Cited

U.S. PATENT DOCUMENTS

| | | | |
|---|---|---|---|
| 2016/0064259 A1* | 3/2016 | Kurusu | H01L 21/67017 134/99.1 |
| 2018/0025921 A1* | 1/2018 | Kabune | H01L 21/302 438/754 |

* cited by examiner

SUBSTRATE PROCESSING APPARATUS AND SUBSTRATE PROCESSING METHOD

CROSS-REFERENCE TO RELATED APPLICATION

This application claims priority under 35 U.S.C. § 119 to Korean Patent Application No. 10-2021-0098360, filed on Jul. 27, 2021, in the Korean Intellectual Property Office (KIPO), the contents of which are herein incorporated by reference in their entirety.

BACKGROUND

1. Field

Example embodiments relate to a substrate processing apparatus and a substrate processing method. More particularly, example embodiments relate to a substrate processing apparatus for processing a substrate using a plurality of chemical solutions in an extreme ultraviolet (EUV) photo track apparatus and a substrate processing method using the same.

2. Description of the Related Art

A photoresist used in an EUV photo track equipment may contain a metal component, and a plurality of chemical solutions may be used to clean a wafer in a coating process or a developing process. The chemical solutions may be discarded after cleaning.

SUMMARY

According to example embodiments, a substrate processing apparatus may include a substrate support configured to support and rotate a substrate, at least one first lower cleaning nozzle configured to spray a first cleaning liquid having a first physical property on a lower surface of the substrate, at least one second lower cleaning nozzle configured to spray a second cleaning liquid having a second physical property different from the first physical property on the lower surface of the substrate, a bowl structure disposed around the substrate support, the bowl structure including a cup body providing an annular shaped accommodating space for accommodating a chemical solution scattered from the substrate and inner and outer collection portions sequentially arranged in a radial direction in a lower portion of the cup body, an annular shaped discharge guide plate disposed in the receiving space of the bowl structure under the substrate and extending outwardly from a circumference of the substrate, and a discharge separation plate provided within the receiving space of the bowl structure to be movable upward and downward, wherein when the discharge separation plate is in a lowered position the discharge separating and the discharge guide plate together form a first discharge path through which the first cleaning liquid scattered from the substrate is collected in the outer collection portion, and when the discharge separation plate in a raised position the discharge separating and the discharge guide plate together form a first discharge path through which the second cleaning liquid scattered from the substrate is collected in the inner collection portion.

According to example embodiments, a substrate processing apparatus may include a substrate support configured to support and rotate a substrate, a treatment liquid spray nozzle configured to spray a treatment liquid on an upper surface of the substrate, at least one first upper cleaning nozzle configured to spray a first cleaning liquid toward an edge region of the upper surface of the substrate, at least one second upper cleaning nozzle configured to spray a second cleaning liquid toward the edge region of the upper surface of the substrate, at least one first lower cleaning nozzle configured to spray the first cleaning liquid on a lower surface of the substrate, at least one second lower cleaning nozzle configured to spray the second cleaning liquid on the lower surface of the substrate, a bowl structure disposed around the substrate support, the bowl structure configured to provide an annular shaped accommodating space for accommodating a chemical solution scattered from the substrate, the bowl structure including inner and outer collection portions sequentially arranged in a radial direction in a lower space of the accommodating space, an annular shaped discharge guide plate disposed in the accommodating space of the bowl structure under the substrate and extending outwardly from a circumference of the substrate, and a discharge separation plate provided movable upward and downward within the receiving space of the bowl structure, wherein when the discharge separation plate is in a first position the discharge separating and the discharge guide plate together form a first discharge path through which the first cleaning liquid scattered from the substrate is collected in the outer collection portion, and when the discharge separation plate in a second position the discharge separating and the discharge guide plate together form a second discharge path through which the second cleaning liquid scattered from the substrate is collected in the inner collection portion.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
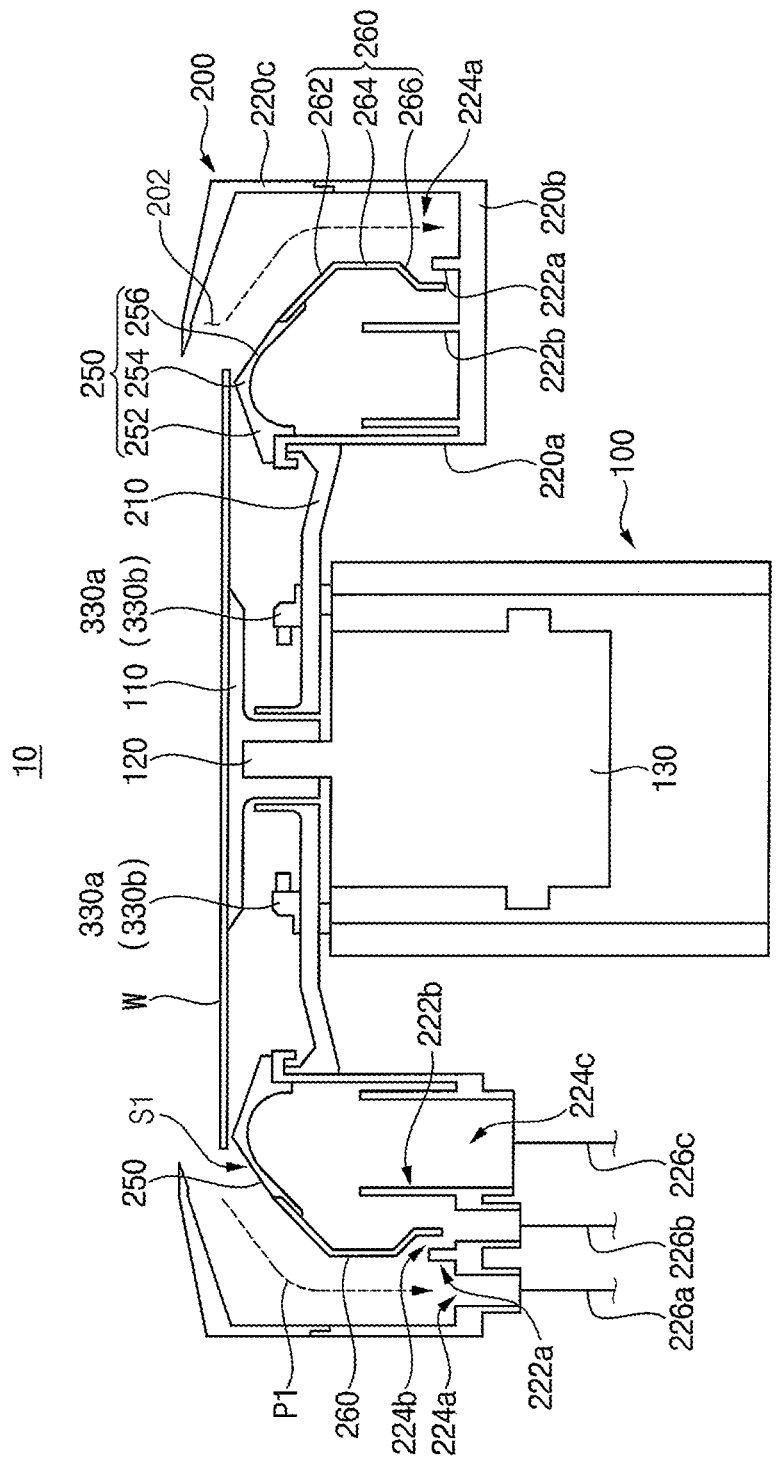
FIG. 1 is a cross-sectional view illustrating a substrate processing apparatus in accordance with example embodiments.
Figure 2:
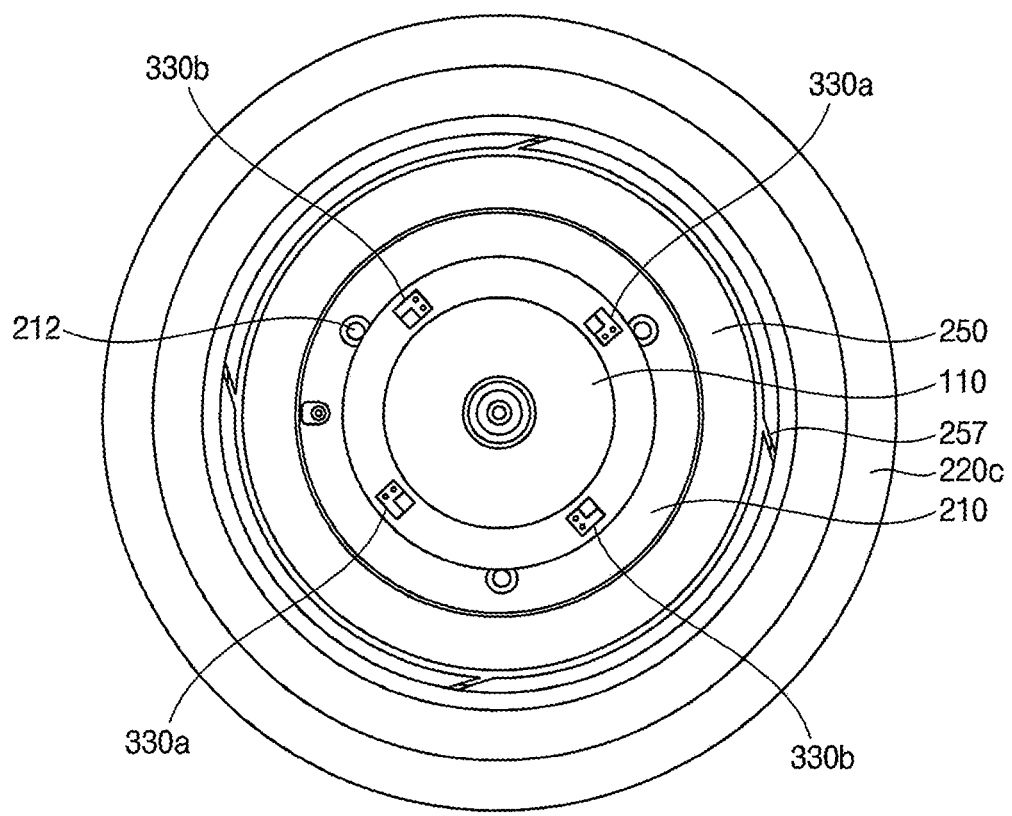
FIG. 2 is a plan view illustrating the substrate processing apparatus in FIG. 1.
Figure 3:
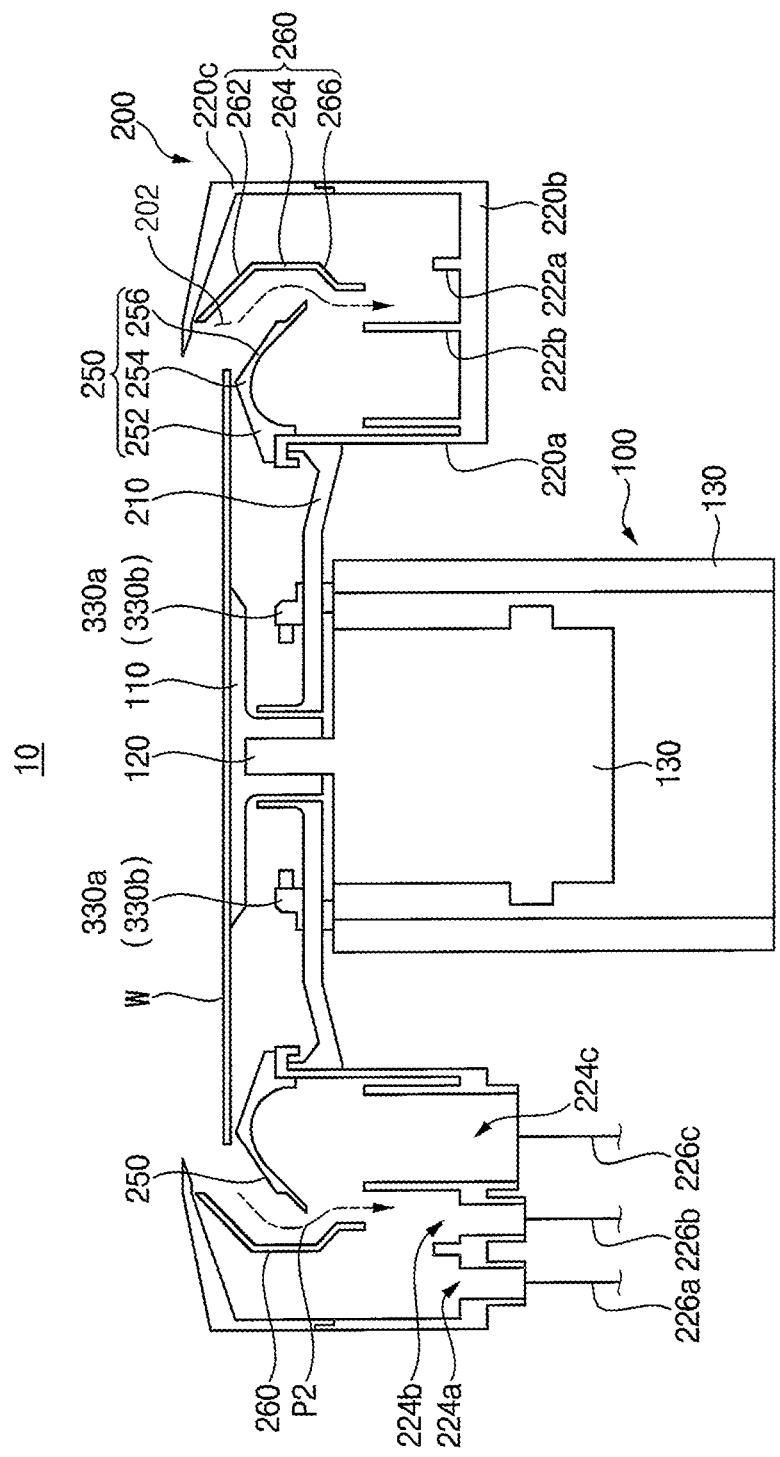
FIG. 3 is a cross-sectional view illustrating the substrate processing apparatus of FIG. 1, in which a discharge separation plate is raised to a second position.
Figure 4:
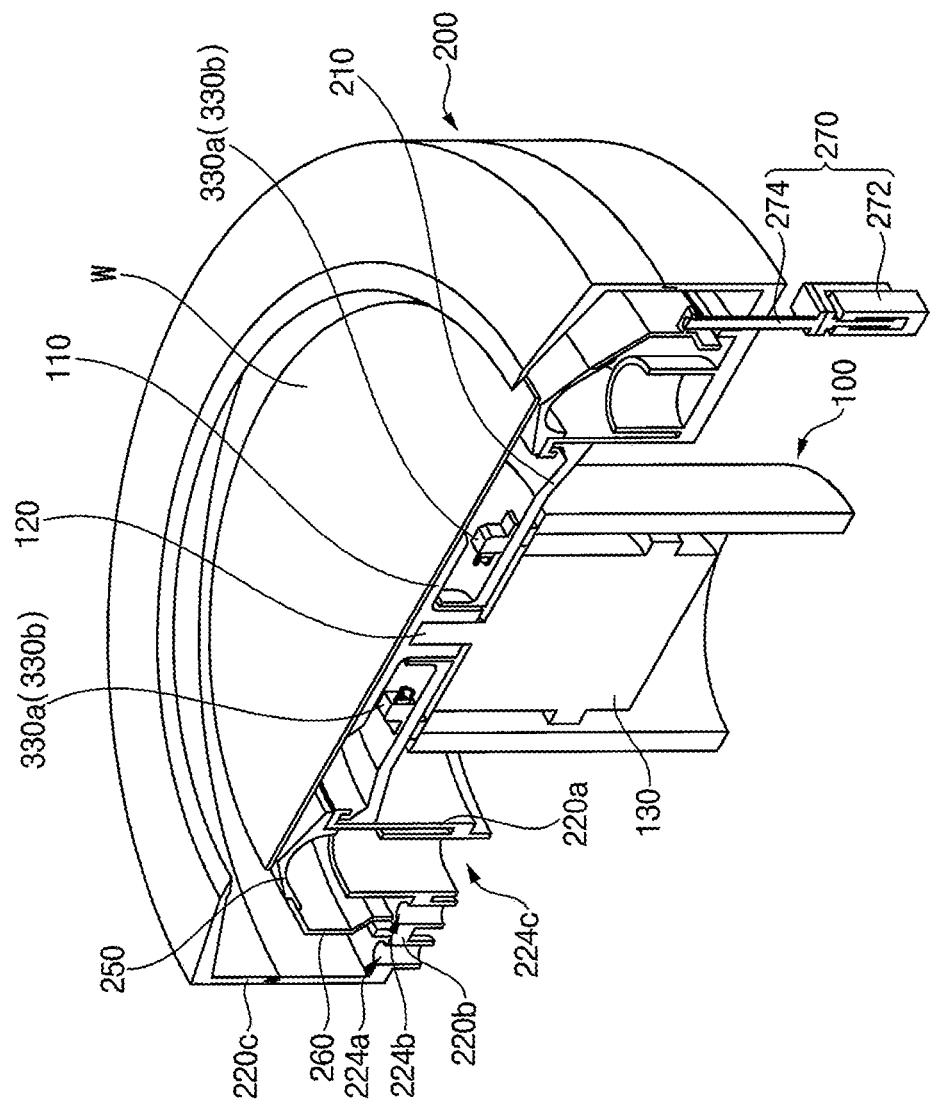
FIG. 4 is a partially cut-away perspective view illustrating the substrate processing apparatus in FIG. 1.
Figure 5:
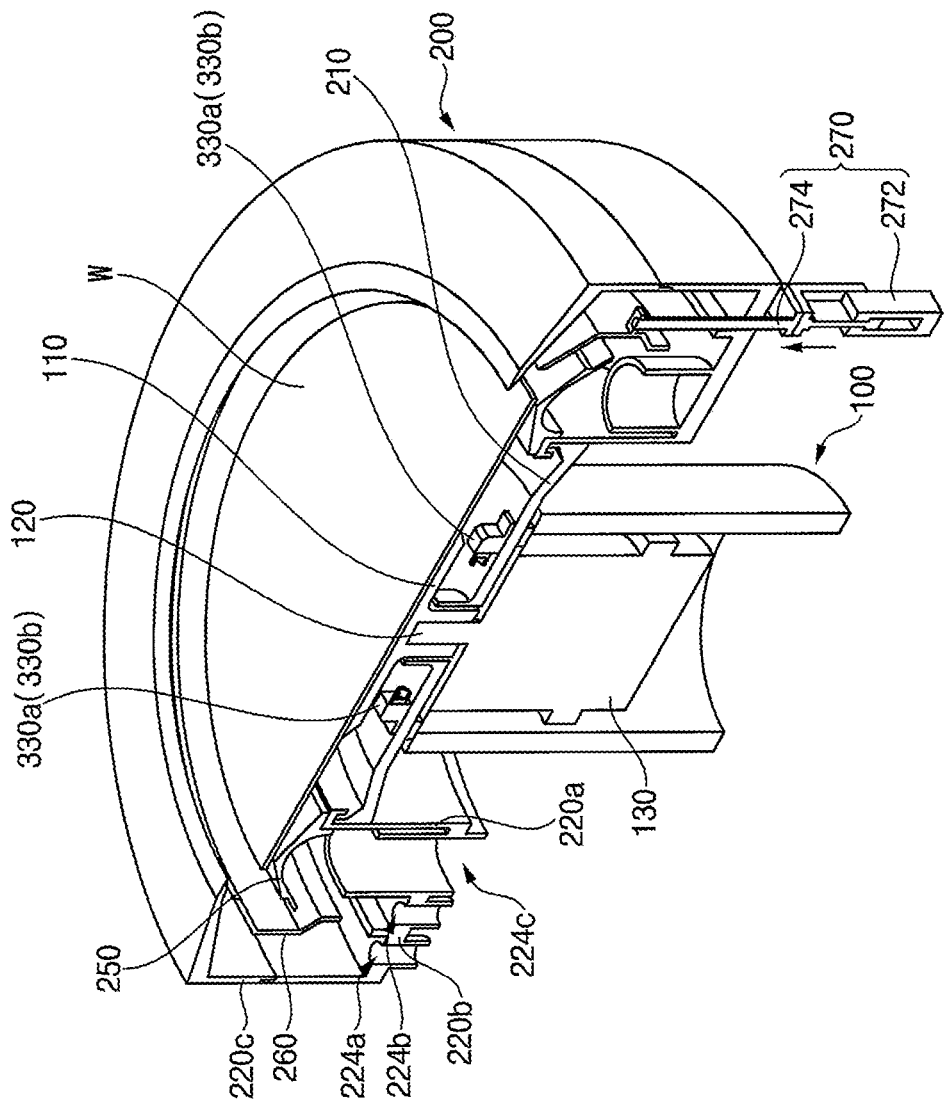
FIG. 5 is a partially cut-away perspective view illustrating the substrate processing apparatus in FIG. 3.
Figure 6:
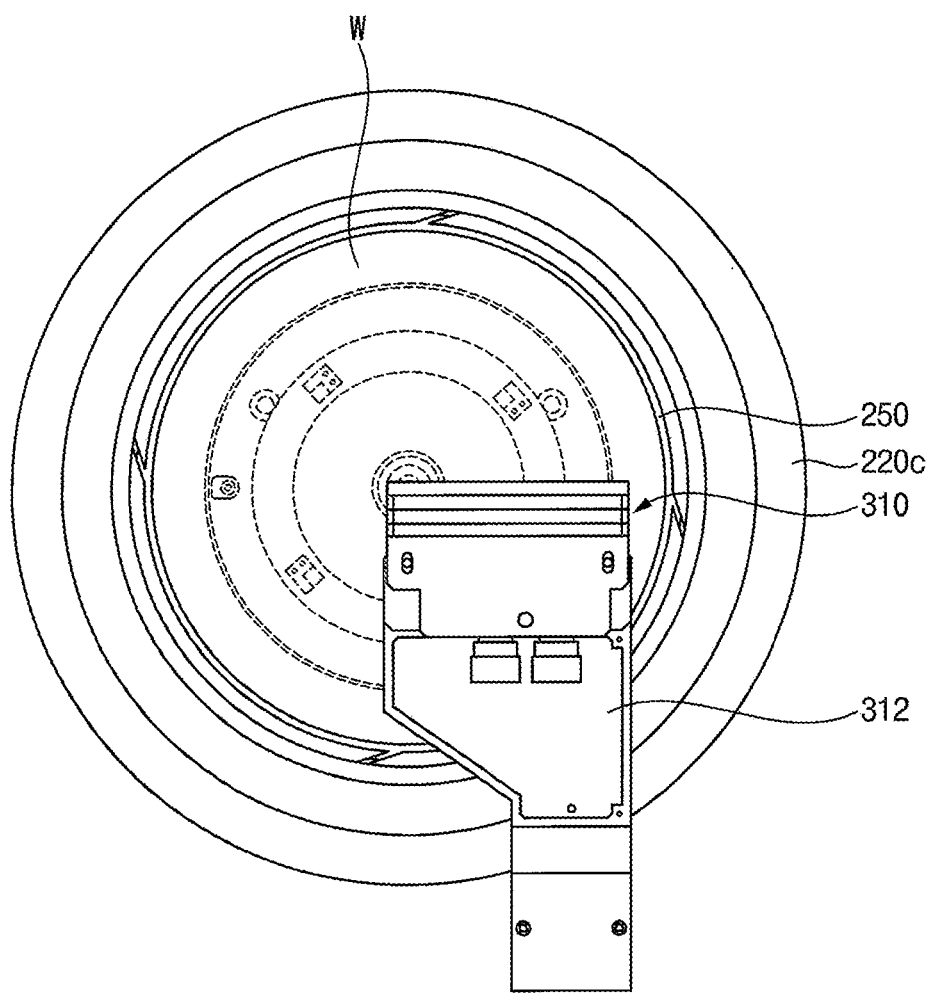
FIG. 6 is a plan view illustrating a photoresist supply nozzle of a nozzle unit of the substrate processing apparatus in FIG. 1.
Figure 7:
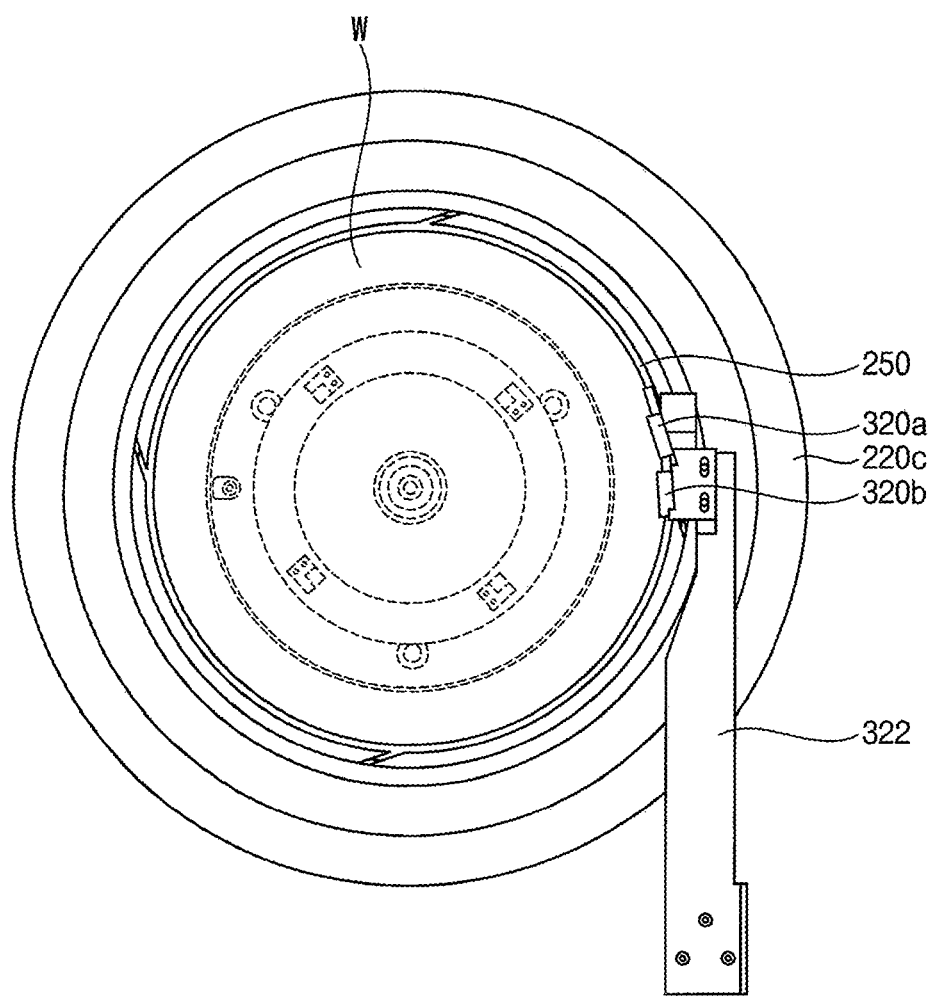
FIG. 7 is a plan view illustrating first and second upper cleaning liquid supply nozzles of the nozzle unit of the substrate processing apparatus in FIG. 1.
Figure 8:
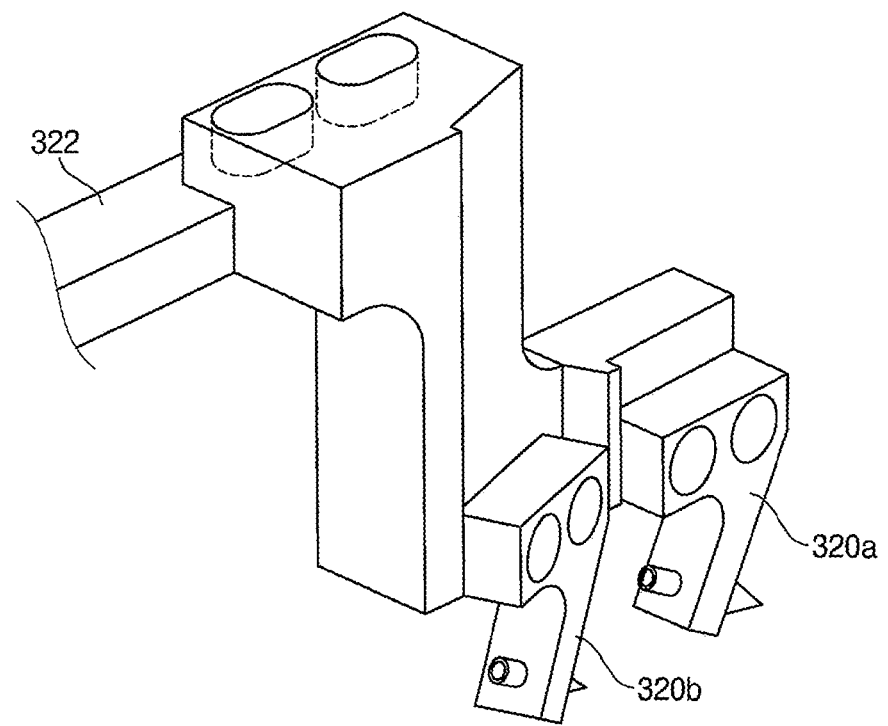
FIG. 8 is a perspective view illustrating the first and second upper cleaning liquid supply nozzles in FIG. 7.

FIG. 1 is a cross-sectional view illustrating a substrate processing apparatus in accordance with example embodiments. FIG. 2 is a plan view illustrating the substrate processing apparatus in FIG. 1. FIG. 3 is a cross-sectional view illustrating the substrate processing apparatus of FIG. 1, in which a discharge separation plate is raised to a second position. FIG. 4 is a partially cut-away perspective view illustrating the substrate processing apparatus in FIG. 1. FIG. 5 is a partially cut-away perspective view illustrating the substrate processing apparatus in FIG. 3. FIG. 6 is a plan view illustrating a photoresist supply nozzle of a nozzle unit of the substrate processing apparatus in FIG. 1. FIG. 7 is a plan view illustrating first and second upper cleaning liquid supply nozzles of the nozzle unit of the substrate processing apparatus in FIG. 1. FIG. 8 is a perspective view illustrating the first and second upper cleaning liquid supply nozzles in FIG. 7. FIG. 1 is a cross-sectional view illustrating the substrate processing apparatus in FIG. 1, in which the discharge separation plate is lowered to a first position.

Referring to FIGS. 1 to 8, a substrate processing apparatus 10 may include a substrate support 100, a bowl assembly 200 and a nozzle unit.

In example embodiments, the substrate processing apparatus 10 may be used as a spin coater configured to support and rotate a substrate, e.g., a wafer W, and coat a photoresist layer on the substrate or a as developing apparatus configured to develop an exposed photoresist layer on the substrate. A plurality of the substrate processing apparatus 10 may be provided in an EUV photo track equipment to perform a photoresist coating process and a developing process on the substrate.

For example, a wafer may be transferred into the spin coater through an index module of the EUV track facility, e.g., equipment, and then, a photoresist layer may be coated on the wafer by the spin coater. Then, the wafer may be transferred to a heating unit by a transfer robot, and the wafer may be baked in the heating unit and then cooled. After the cooled wafer is transferred to an exposure apparatus through an interface unit, an exposure process may be performed on the photoresist layer coated on the wafer. After exposure, the wafer may be transferred into the developing apparatus, and then, the wafer may be developed using a developer, e.g., tetramethylammonium hydroxide (TMAH), to form a photoresist pattern.

As illustrated in FIGS. 1 and 2, the substrate support 100 may support the wafer W and rotate the wafer W at a desired rotation speed. The substrate support 100 may serve as a spin chuck for adsorbing the central portion of a lower surface of the wafer W to horizontally hold the wafer W. The substrate support 100 may include a support plate 110, a rotational shaft 120, and a driving portion 130.

The support plate 110 may be connected to the rotational shaft 120, and the rotational shaft 120 may be rotated by a rotational driving force of the driving portion 130 to rotate the support plate 110. When the support plate 110 rotates, the wafer W may be adsorbed and fixed on the support plate 110.

The driving portion 130 may be electrically connected to a controller, and the rotation speed of the support plate 110 may be controlled based on a control signal from the controller. For example, the wafer W may be rotated by the substrate support 100 at a rotation speed within a range of 10 rpm to 3,000 rpm.

Additionally, the substrate support 100 may include a plurality of support pins for raising the wafer W with respect to the support plate 110 and a lifting mechanism for elevating the support pins. The support pins may be provided to be movable up and down within a pin guide hole 212 formed in a base plate 210 which is fixedly installed on a support frame of the driving portion 130.

The lifting mechanism may operate to elevate the support pins based on the control signal from the controller. The support pins may rise to move the wafer W supported on the support plate 110 upward. Also, the wafer W may be disposed on the raised support pins, and the support pins may be lowered to load the wafer W on the support plate 110.

Referring to FIGS. 1 and 3, the bowl assembly 200 may collect and discharge a chemical solution supplied to the wafer (W). When the substrate support 100 rotates the wafer W at a desired speed, the chemical solution may be supplied on an upper surface or a lower surface of the wafer W by the nozzle unit. When the wafer W rotates, the chemical solution scattered from the wafer W may be collected and discharged by the bowl assembly 200.

The bowl assembly 200 may include a multi-stage bowl structure having an annular ring shape to surround the substrate support 100, e.g., the bowl assembly 200 may extend around an entire perimeter of an upper portion of the substrate support 100 (e.g., as viewed in a top view). The multi-stage bowl structure may include a cup body providing an accommodating space 202 with an open top, and first and second collection portions 224a and 224b sequentially provided on a lower surface of the cup body. The first collection portion 224a may be an annular shaped outer collection portion adjacent to an outer sidewall of the cup body, and the second collection portion 224b may be an annular shaped inner collection portion adjacent to an inner sidewall of the cup body. That is, the inner collection portion and the outer collection portion may be sequentially arranged in a radial direction from the substrate support 100. For example, referring to FIG. 1, the first and second collection portions 224a and 224b may be outer and inner collecting portions, respectively, that may be arranged annularly around the substrate support 100, e.g., the second collection portion 224b (inner collection portion) may be between the substrate support 100 and the first collection portion 224a (outer collection portion) as viewed in a top view.

The cup body may include an inner sidewall 220a coupled to an outer side portion of the base plate 210 to be supported and extending downwardly from the outer side portion, an annular shaped lower wall 220b extending in a horizontal direction from a lower end portion of the inner sidewall 220a, and an outer sidewall 220c extending upwardly from an outer end portion of the lower wall 220b. The cup body including the inner sidewall 220a, the lower wall 220b, and the outer sidewall 220c may provide the annular shaped accommodating space 202 to accommodate the chemical solution scattered from the wafer (W).

A first sidewall 222a may be provided on the lower wall 220b between the inner sidewall 220a and the outer sidewall 220c to extend upwardly to have a predetermined height, e.g., the first sidewall 222a may extend from the lower wall 220b to a predetermined height into the accommodating space 202 to at least partially separate the accommodating space 202. That is, the first sidewall 222a may extend, e.g., continuously, along an extending direction of the lower wall 220b, e.g., around an entire perimeter of the substrate support 100, to define, e.g., and separate between, the first and second collection portions 224a and 224b. The first collection portion 224a may serve as an annular shaped first collection container disposed in the outermost side, and the second collection portion 224b may serve as an annular shaped second collection container disposed in the inner side relative to the first collection portion 224a.

In addition, a second sidewall 222b may be provided on the lower wall 220b between the inner sidewall 220a and the first sidewall 222a to extend upwardly to have a predetermined height, e.g., the second sidewall 222b may extend from the lower wall 220b to a predetermined height into the accommodating space 202 to at least partially separate the accommodating space 202. The second sidewall 222b may extend, e.g., continuously, in the extending direction of the lower wall 220b to define a third collection portion 224c within the second collection portion 224b. The third collection portion 224c may serve as an annular shaped third collection container disposed in the inner side relative to the second collection portion 224b, e.g., the second collection portion 224b may be between the first and third collection portions 224a and 224c.

As will be described later, a first chemical solution having a first physical property may be collected by the first collection portion 224a and then may be discharged through a first discharge line 226a connected to the first collection portion 224a. A second chemical solution having a second physical property different from the first physical property may be collected by the second collection portion 224b and then may be discharged through a second discharge line 226b connected to the second collection portion 224b. Meanwhile, a gas generated during the supply of the chemical solution may be discharged through the third collection portion 224c and a third discharge line 226c.

As illustrated in FIGS. 1, 3, 4 and 5, the bowl assembly 200 may include a discharge guide plate 250 that is disposed in the accommodating space 202 of the multi-stage bowl structure under the wafer W and extends in an outer direction from the circumference of the wafer W. The discharge guide plate 250 may have an upwardly convex bowl shape having an annular shape extending along the circumference of the wafer W under the wafer W.

In particular, the discharge guide plate 250 may be coupled to and supported by an upper end portion of the inner sidewall 220a. The discharge guide plate 250 may include an upwardly inclined plate 252 extending from an upper portion of the inner sidewall 220a toward an edge region of the lower surface of the wafer W, a top portion 254 closest to the lower surface of the wafer W, and a downwardly inclined plate 256 extending from the top portion 254 outwardly from the wafer W.

As will be described later, the discharge guide plate 250 may guide the chemical solution supplied to the lower surface of the wafer W to be discharged into the accommodating space 202, i.e., a receiving space, of the multi-stage bowl structure in the outer direction from the wafer W, such that the chemical solution is prevented from scattering toward the center of the substrate support 100. Additionally, the discharge guide plate 250 may be disposed to be spaced apart from the lower surface of the wafer W by a predetermined spacing distance, so that the chemical solution (gas) scattered between the lower surface of the wafer W and an upper surface of the discharge guide plate 250 can be controlled to flow smoothly.

As illustrated in FIGS. 1, 3, 4, and 5, the bowl assembly 200 may include a discharge separation plate 260 that is provided in an outer region of the wafer W and is movable upward and downward within the accommodating space 202 of the multi-stage bowl structure and a lifting unit 270.

The discharge separation plate 260 may have an outwardly convex vertical plate shape, e.g., relative to the substrate support 100, and may extend, e.g., continuously, along the circumference of the wafer W in the accommodating space 202 in an annular shape. In particular, the discharge separation plate 260 may include an upper inclined plate 262 inclined upwardly toward the inside, e.g., toward a center of the wafer W, a vertical plate 264 extending in a vertical direction downwardly from the upper inclined plate 262, and a lower inclined plate 266 inclined downwardly from the vertical plate 264 toward the inside, e.g., toward a center of the substrate support 100. For example, referring to FIG. 1, an overall shape of the discharge separation plate 260 may be convex, e.g., bulging away, relative to a center axis of the substrate support 100.

The discharge separation plate 260 may include an acid-resistant or alkali-resistant material. The discharge separation plate 260 may be detachably installed in the multi-stage bowl structure for regular maintenance.

As illustrated in FIG. 4-5, the lifting unit 270 may include an elevating bar 274 coupled to the discharge separation plate 260 and an elevating driving portion 272 for vertically moving the elevating bar 274. An upper end portion of the elevating bar 274 may be coupled to a flange provided on an outer wall of the vertical plate 264. As the elevating bar 274 moves up and down, the discharge separation plate 260 may move up and down. The elevating driving portion 272 may be connected to the controller. Based on the control signal from the controller, the elevating bar 274 may be raised or lowered.

Referring to FIG. 1, when the discharge separation plate 260 is in a lowered position (i.e., a first position), an upper end portion of the discharge separation plate 260 (i.e., the upper inclined plate 262) may come into contact with a lower end portion of the discharge guide plate 250 (i.e., with the downwardly inclined plate 256), and a lower end portion of the discharge separation plate 260 (i.e., the lower inclined plate 266) may be lowered to overlap the first sidewall 222a, e.g., so a combined structure of the discharge separation plate 260 with the discharge guide plate 250 may separate between the first and second collection portions 224a and 224b. Accordingly, a portion of the discharge guide plate 250 (i.e., the downwardly inclined plate 256) and the discharge separation plate 260 may form a first discharge path P1 through which the chemical solution scattered from the wafer W is collected into the first collection portion 224a, e.g., as the second collection portion 224b may be blocked from the first discharge path P1 by the discharge separation plate 260. The first discharge path P1 (i.e., indicated by the dashed arrow in FIG. 1) may be formed between an outer surface of the discharge separation plate 260 and an inner surface of the inner sidewall 220a. At this time, the chemical solution supplied on the upper and lower surfaces of the wafer W may be collected in the first collection portion 224a through the first discharge path P1.

Referring to FIG. 3, when the discharge separation plate 260 is in a raised position (i.e., a second position), the upper end portion of the discharge separation plate 260 (i.e., the upper inclined plate 262) may be spaced apart from the lower end portion of the discharge guide plate 250 (i.e., from the downwardly inclined plate 256) to be positioned higher than the wafer W, e.g., the upper inclined plate 262 may be lifted up from the discharge guide plate 250 to define a space therebetween. Accordingly, a portion of the discharge guide plate 250 (i.e., the downwardly inclined plate 256) and the discharge separation plate 260 may form a second discharge path P2 (i.e., indicated by the dashed arrow in FIG. 3) through which the chemical solution scattered from the wafer W is collected in the second collection portion 224b. The second discharge path P2 may be formed between the outer surface of the discharge guide plate 250 and an inner surface of the discharge separation plate 260, e.g., to be guided into the second collection portion 224b. At this time, the chemical solution supplied on the upper and lower surfaces of the wafer W may be collected in the second collection portion 224b through the second discharge path P2.

As shown in FIG. 6, the nozzle unit may include a treatment liquid spray nozzle 310 for spraying a treatment liquid, e.g., a coating liquid, a developer, etc., on the upper surface of the wafer W. A plurality of the treatment liquid spray nozzles may be provided to spray the treatment liquid on the upper surface of the wafer W. The treatment liquid spray nozzle 310 may be provided in a first end portion of a first nozzle arm 312. A second end portion of the first nozzle arm 312 opposite to the first end portion may be connected to a first nozzle movement mechanism. The treatment liquid spray nozzle 310 may be installed to be movable vertically and horizontally by the first nozzle movement mechanism.

The coating liquid may include a photoresist solution. The developer may include a chemical solution, e.g., tetramethylammonium hydroxide (TMAH). In the coating process of the EUV photoresist layer, the photoresist solution may include a metal material, e.g., tin.

As illustrated in FIGS. 7 and 8, the nozzle unit may include a first upper cleaning nozzle 320a and a second upper cleaning nozzle 320b for spraying a first cleaning liquid and a second cleaning liquid on the edge region of the upper surface of the wafer W, respectively, e.g., the first and second upper cleaning nozzles 320a and 320b may be positioned at a height above the bowl assembly 200 (e.g., above a top portion of the outer sidewall 220c) relative to the substrate support 100. The first and second upper cleaning nozzles 320a and 320b may be disposed adjacent to each other along the edge of the wafer W in order to spray the chemical solution onto the edge region of the upper surface of the wafer W. The first and second upper cleaning nozzles 320a and 320b may be provided in a first end portion of a second nozzle arm 322. A second end portion of the second nozzle arm 322 opposite to the first end portion may be connected to a second nozzle movement mechanism. The first and second upper cleaning nozzles 320a and 320b may be installed to be movable vertically and horizontally by the second nozzle movement mechanism.

The first cleaning liquid may be sprayed on the edge region of the upper surface of the wafer W to remove an edge bead portion of the photoresist layer coated on the edge region. The second cleaning liquid may be sprayed onto the edge region of the upper surface of the wafer W to remove the metal material remaining on a portion of the photoresist layer which remains after being removed by the first cleaning liquid. The first cleaning liquid may include a first chemical solution having a first physical property. The second cleaning liquid may include a second chemical solution having a second physical property different from the first physical property. For example, the first cleaning solution may include an organic solvent. The second cleaning solution may include an acidic or basic aqueous solution. Examples of the acidic aqueous solution may be HF, $H_2O_2$, etc.

As illustrated FIG. 2, the nozzle unit includes a first lower cleaning nozzle 330a and a second lower cleaning nozzle 330b for spraying a third cleaning liquid and a fourth cleaning liquid on the lower surface of the wafer W, respectively, e.g., the first and second lower cleaning nozzles 330a and 330b may be connected to different cleaning liquid supply sources for providing the respective third and fourth cleaning liquids. The first lower cleaning nozzle 330a and the second lower cleaning nozzle 330b may be installed on the base plate 210 under the wafer W. For example, two first lower cleaning nozzles 330a may spray the third cleaning liquid in a first direction and a direction opposite to the first direction, respectively, and two second lower cleaning nozzles 330b may spray the fourth cleaning liquid in a second direction crossing the first direction and in a direction opposite to the second direction, respectively.

The third cleaning liquid may be sprayed on the lower surface of the wafer W to remove the photoresist layer coated on the lower surface including the edge region. The fourth cleaning liquid may be sprayed on the lower surface of the wafer W to remove the metal material remaining on a portion of the photoresist film which remains after being removed by the third cleaning liquid. The third cleaning liquid may include a third chemical solution having the first physical property. The fourth cleaning liquid may include a fourth chemical solution having the second physical property different from the first physical property. For example, the third cleaning liquid may include an organic solvent. The fourth cleaning solution may include an acidic or basic aqueous solution.

The first and third cleaning solutions may include the same chemical solution having the first physical property. The second and fourth cleaning solutions may include the same chemical solution having the second physical property.

In the coating process or the developing process, after spraying the coating solution or the developing solution on the wafer, residual contaminants (e.g., photoresist or photoresist residues) called as edge beads may be formed on the edge region of the wafer. The edge bead may be formed to surround the upper and lower surfaces of the edge region of the wafer. If the edge beads are not cleaned, they may contaminate a transfer robot or a buffer chamber in subsequent processes, making it difficult to manage particles inside the equipment.

The first upper cleaning nozzle 320a and the first lower cleaning nozzle 330a may spray the first chemical solution (e.g., organic solvent) having the first physical property to remove the edge bead formed in the edge region. Further, since in EUV photo equipment, the photoresist may contain a metal material, e.g., tin, the second upper cleaning nozzle 320b and the second lower cleaning nozzle 330b may spray a second chemical solution (e.g., an acidic aqueous solution) having the second physical property different from the first physical property to remove the metal material.

In example embodiments, when the discharge separation plate 260 is in the lowered position (i.e., the first position), the first upper cleaning nozzle 320a and the first lower cleaning nozzles 330a may spray the first chemical solution on the upper and lower surfaces of the wafer W, respectively. The first chemical solution scattered from the wafer W may be collected in the first collection portion 224a along the first discharge path P1 (FIG. 1).

Further, when the discharge separation plate 260 is in the raised position (i.e., the second position), the second upper cleaning nozzle 320b and the second lower cleaning nozzles 330b may spray the second chemical on the upper and lower surfaces of the wafer W, respectively. The second chemical solution scattered from the wafer W may be collected in the second collection portion 224b along the second discharge path P2 (FIG. 3).

Hereinafter, a detailed configuration of the discharge guide plate 250 will be explained.

Figure 9:
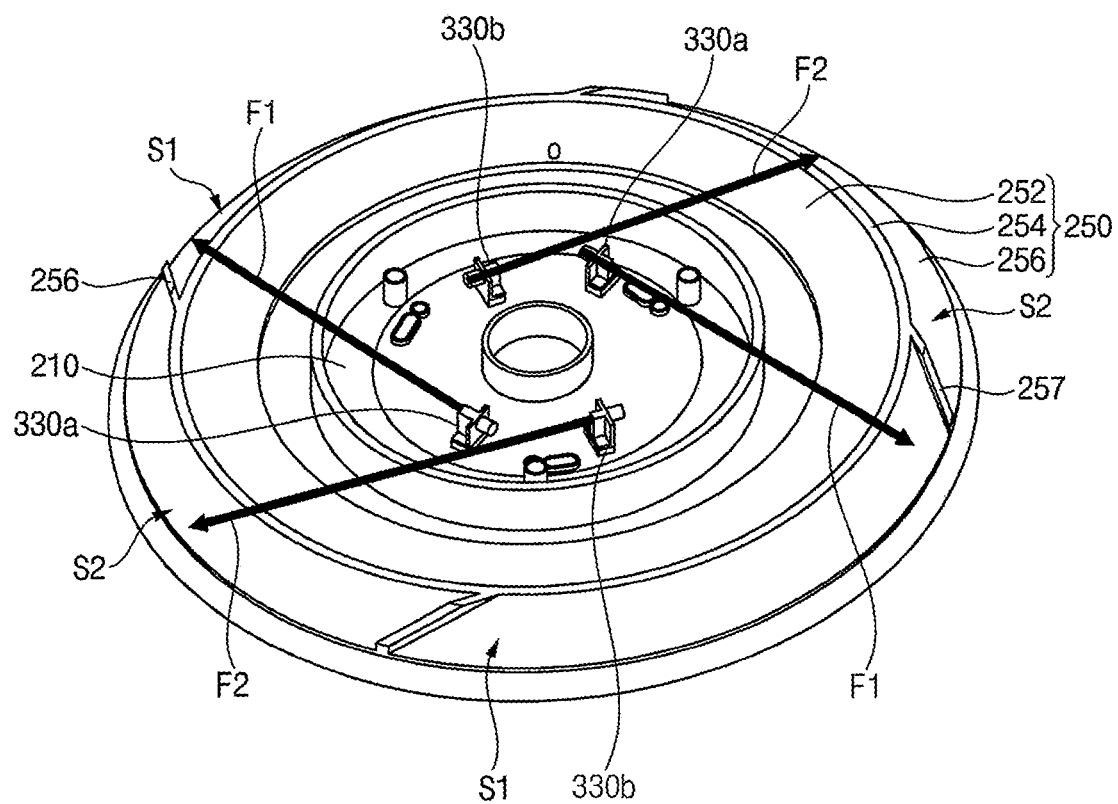
FIG. 9 is a perspective view illustrating a discharge guide plate around first and second lower cleaning nozzles in accordance with example embodiments.
Figure 10:
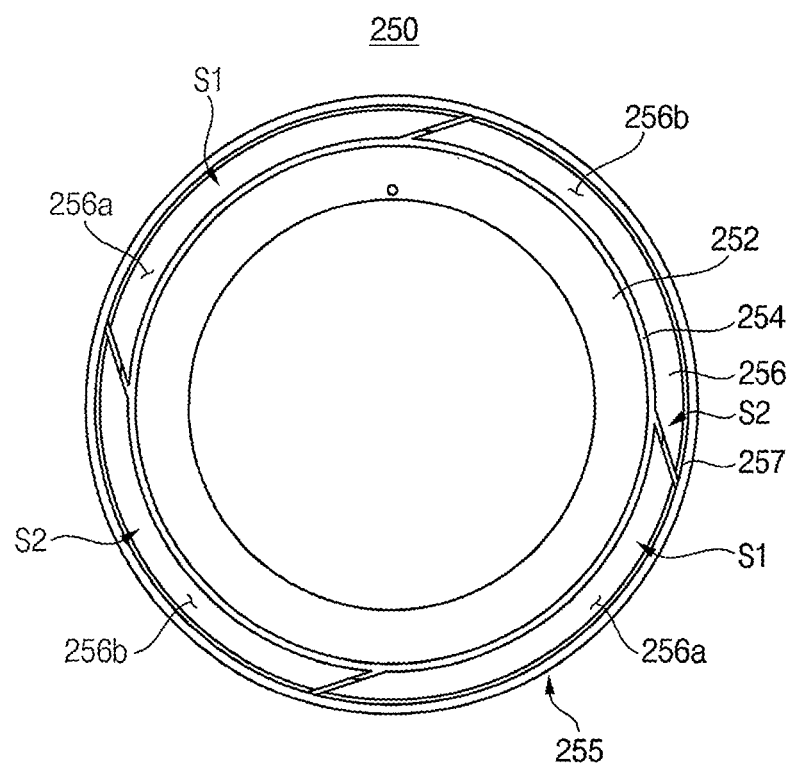
FIG. 10 is a plan view illustrating the discharge guide plate in FIG. 9.
Figure 11:
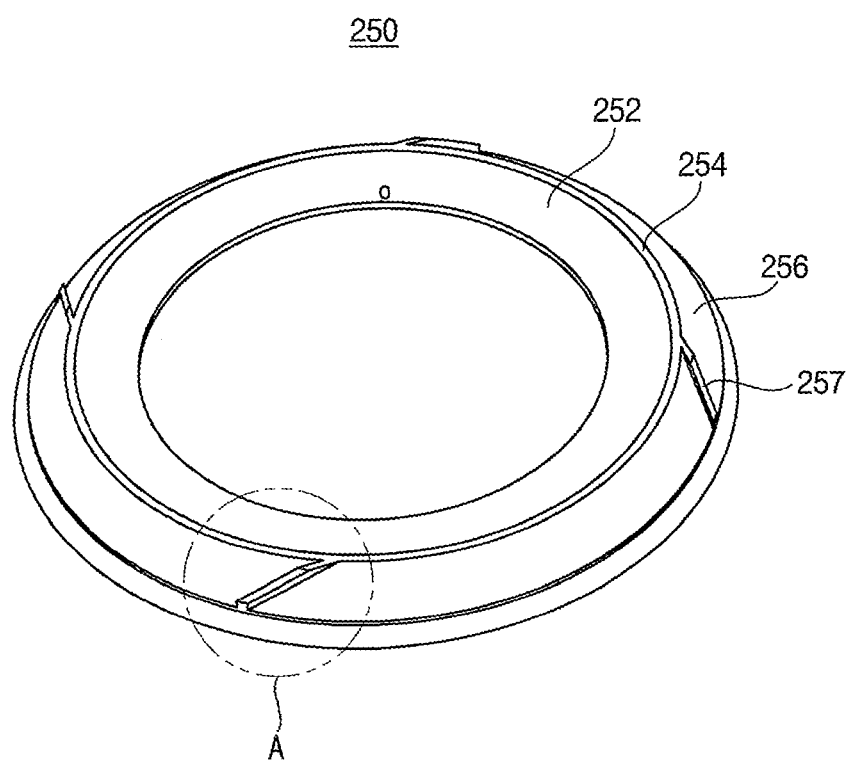
FIG. 11 is a perspective view illustrating the discharge guide plate in FIG. 10.
Figure 12:
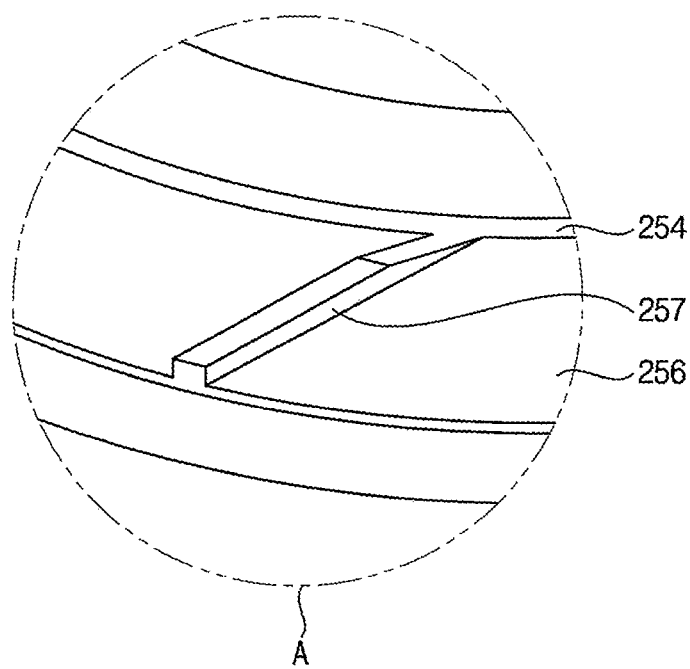
FIG. 12 is an enlarged perspective view illustrating portion 'A' in FIG. 10.

FIG. 9 is a perspective view illustrating the discharge guide plate 250 around first and second lower cleaning nozzles 330a and 330b in accordance with example embodiments. FIG. 10 is a plan view illustrating the discharge guide plate 250 in FIG. 9. FIG. 11 is a perspective view illustrating the discharge guide plate 250 in FIG. 10. FIG. 12 is an enlarged perspective view illustrating portion 'A' in FIG. 10.

Referring to FIGS. 9 to 12, the discharge guide plate 250 may include a bowl-shaped structure having an annular shape extending around two first lower cleaning nozzles 330a and two second lower cleaning nozzles 330b on the base plate 210. The discharge guide plate 250 may include partition walls 257 extending in an oblique direction on the upper surface of the downwardly inclined plate 256, e.g., each of the partition walls 257 may be flush against and extend along the downwardly inclined plate 256 from the top portion 254 to a bottom edge 255 of the inclined plate 256 at an oblique angle with respect to the bottom edge 255. The partition walls 257 may be spaced apart from each other along the extending direction of the downwardly inclined plate 256, e.g., the partition walls 257 may be spaced apart from each other along a circumferential direction of the downwardly inclined plate 256. The number of the partition walls 257 may be determined in consideration of the number of the first and second lower cleaning nozzles 330a and 330b.

A first guide passage S1 and a second guide passage S2 may be defined on the upper surface of the downwardly inclined plate 256 by the partition walls 257. For example, referring to FIGS. 1, 9, and 10, the first and second guide passages S1 and S2 may be defined on the surface of the downwardly inclined plate 256 that faces the outer sidewall 220c of the cup body, such that each of the first and second guide passage S1 and S2 is between adjacent partition walls 257. The first and second guide passages S1 and S2 may be alternately provided along the extending, e.g., circumferential, direction of the downwardly inclined plate 256. The two first lower cleaning nozzles 330a may spray the third cleaning liquid F1 toward the first guide passages S1, respectively, and the two second lower cleaning nozzles 330b may spray the fourth cleaning liquid F2 toward the second guide passages S2, respectively.

The downwardly inclined plate 256 defining the first guide passage S1 may have a first surface 256a, and the downwardly inclined plate 256 defining the second guide passage S2 may have a second surface 256b. The third cleaning liquid sprayed from the first lower cleaning nozzles 330a and scattered from the lower surface of the wafer W may be guided, e.g., through a region between the bottom of the wafer W and the top of the discharge guide plate 250 in FIG. 1, to be discharged into the accommodating space 202 along the first guide passage S1. The fourth cleaning liquid sprayed from the second lower cleaning nozzles 330b and scattered from the lower surface of the wafer W may be guided to be discharged into the accommodating space 202 along the second guide passage S2.

The first surface 256a of the downwardly inclined plate 256 coming into contact with the third cleaning liquid (or first cleaning liquid) may have a hydrophilic surface roughness, e.g., a surface exhibiting high hydrophilicity, and the second surface 256b of the downwardly inclined plate 256 coming into contact with the fourth cleaning liquid (or second cleaning liquid) may have a hydrophobic surface roughness, e.g., a surface exhibiting high hydrophobicity. The first surface 256a of the downwardly inclined plate 256 may include a surface characteristic having a relatively high contact angle with the third cleaning liquid (or the first cleaning liquid), and the second surface 256b of the downwardly inclined plate 256 may include a surface characteristic having a relatively high contact angle with the fourth cleaning liquid (or the second cleaning liquid). For example, the first surface 256a of the downwardly inclined plate 256 may have higher surface energy than the second surface 256b of the downwardly inclined plate 256. Accordingly, the surface contact forces with the third cleaning liquid (or the first cleaning liquid) and the fourth cleaning liquid (or the second cleaning liquid) may be reduced so that the cleaning liquids may be discharged quickly and smoothly from the discharge guide plate 250.

Similarly, the outer surface of the discharge separation plate 260 coming into contact with the third cleaning liquid (or the first cleaning liquid) may have a hydrophilic surface roughness, and the inner surface of the discharge separation plate 260 coming into contact with the third cleaning liquid (or the second cleaning liquid) may have a hydrophobic surface roughness. The outer surface of the discharge separation plate 260 may have a surface characteristic to exhibit a relatively high contact angle with the third cleaning liquid (or the first cleaning liquid), and the inner surface of the discharge separation plate 260 may have a surface characteristic to exhibit a relatively high contact angle with the fourth cleaning liquid (or the second cleaning liquid). For example, the outer surface of the discharge separation plate 260 may have higher surface energy than the inner surface of the discharge separation plate 260. Accordingly, the surface contact forces with the third cleaning liquid (or the first cleaning liquid) and the fourth cleaning liquid (or the second cleaning liquid) may be reduced so that the cleaning liquids may be discharged quickly and smoothly from the discharge guide plate 250.

Hereinafter, a method of processing a substrate using the substrate processing apparatus 10 of FIG. 1 will be explained with reference to FIGS. 13 to 17. FIGS. 13 to 17 are views illustrating stages of a spin coating process using the substrate processing apparatus 10.

Figure 13:
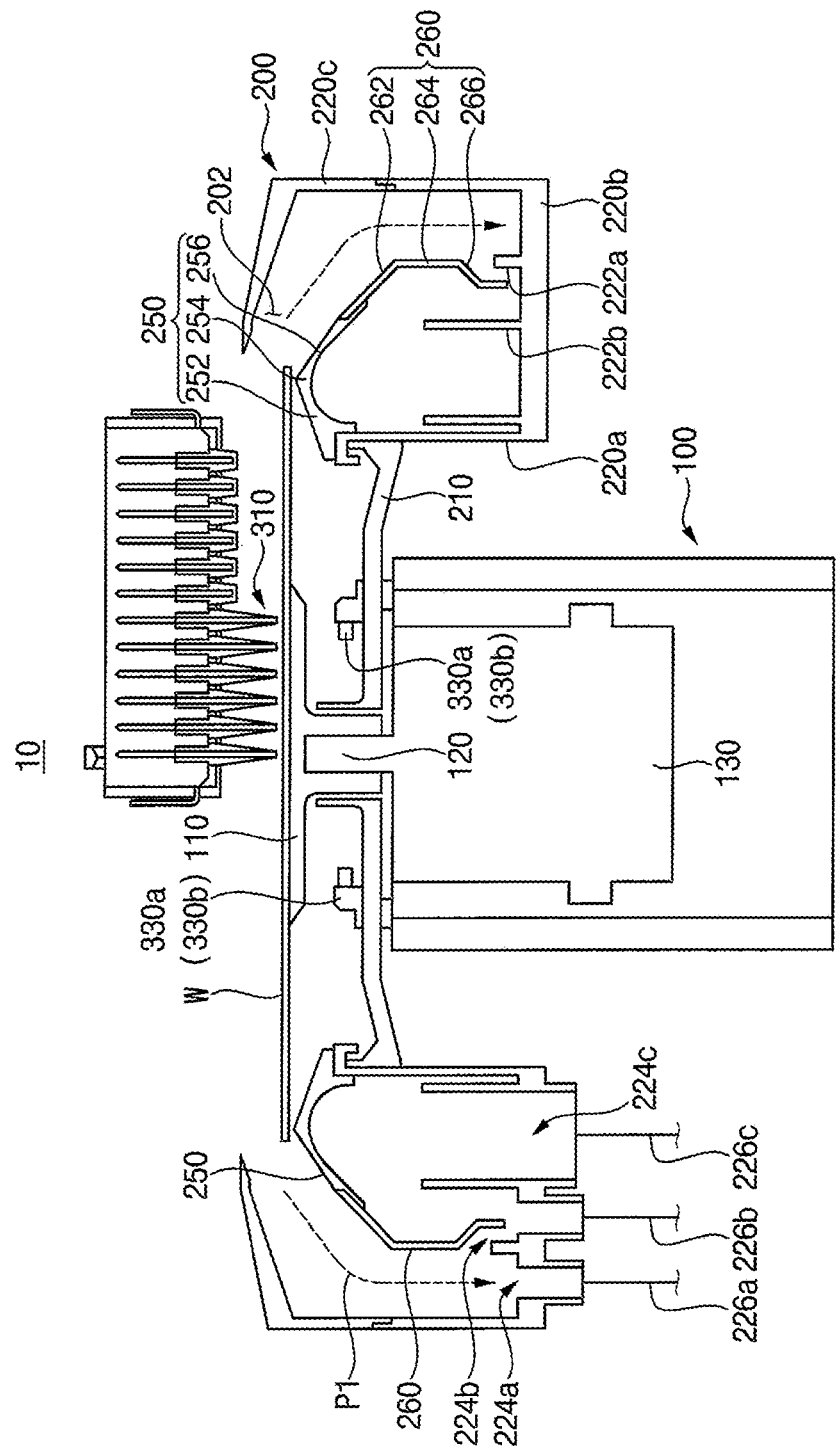
FIGS. 13 to 17 are views illustrating stages in a spin coating process using the substrate processing apparatus in FIG. 1.

Referring to FIG. 13, a coating liquid may be sprayed on the wafer W loaded on the substrate support 100.

In example embodiments, the discharge separation plate 260 may move to a lowered position (i.e., the first position) and a treatment liquid spray nozzle 310 may spray the coating liquid on an upper surface of the wafer W. The coating liquid may include a photoresist solution. The photoresist solution may include a metal material, e.g., tin.

The coating liquid scattered from the wafer W may be collected in a first collection portion 224a along the first discharge path P1 between an outer surface of a discharge separation plate 260 and an inner surface of the inner sidewall 220a and then may be discharged through the first discharge line 226a.

Figure 14:
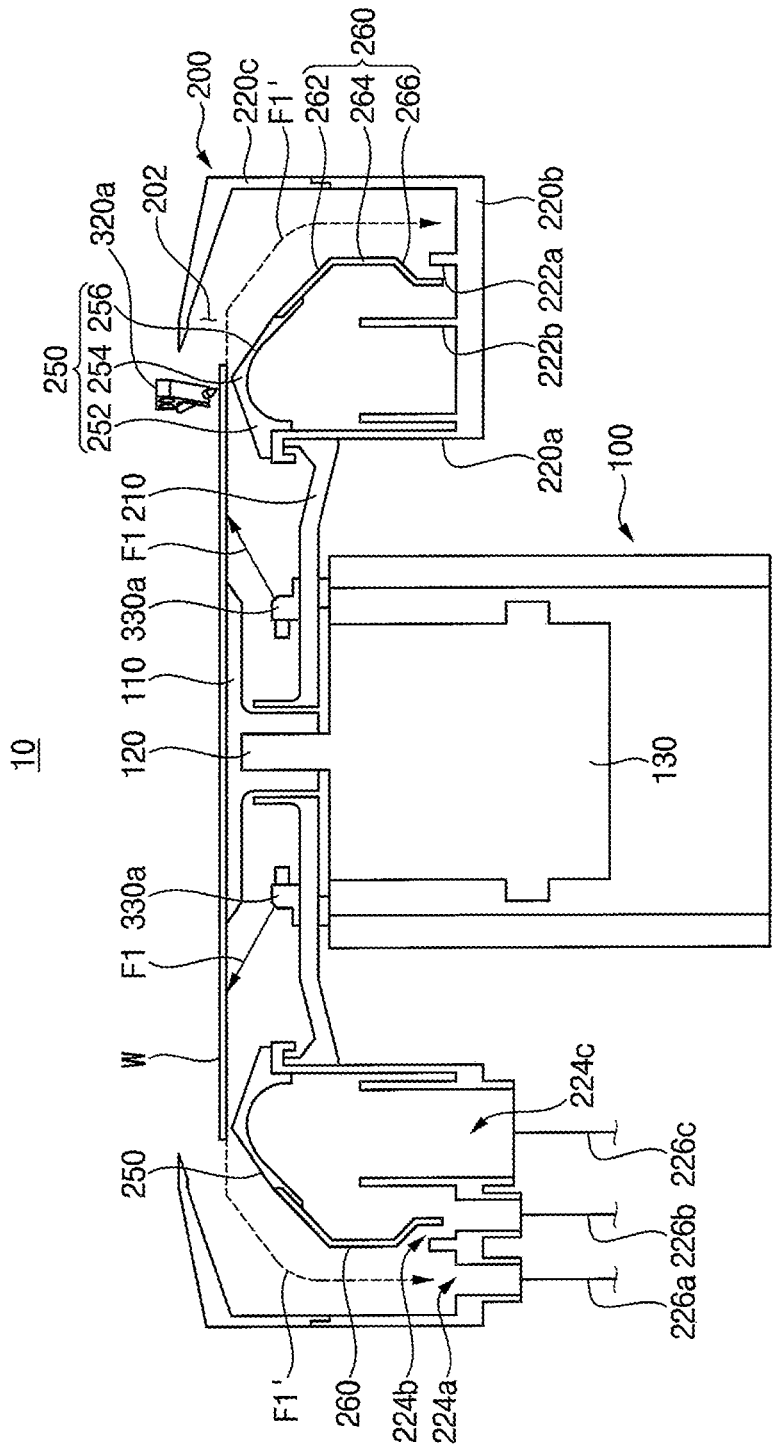
Figure 15:
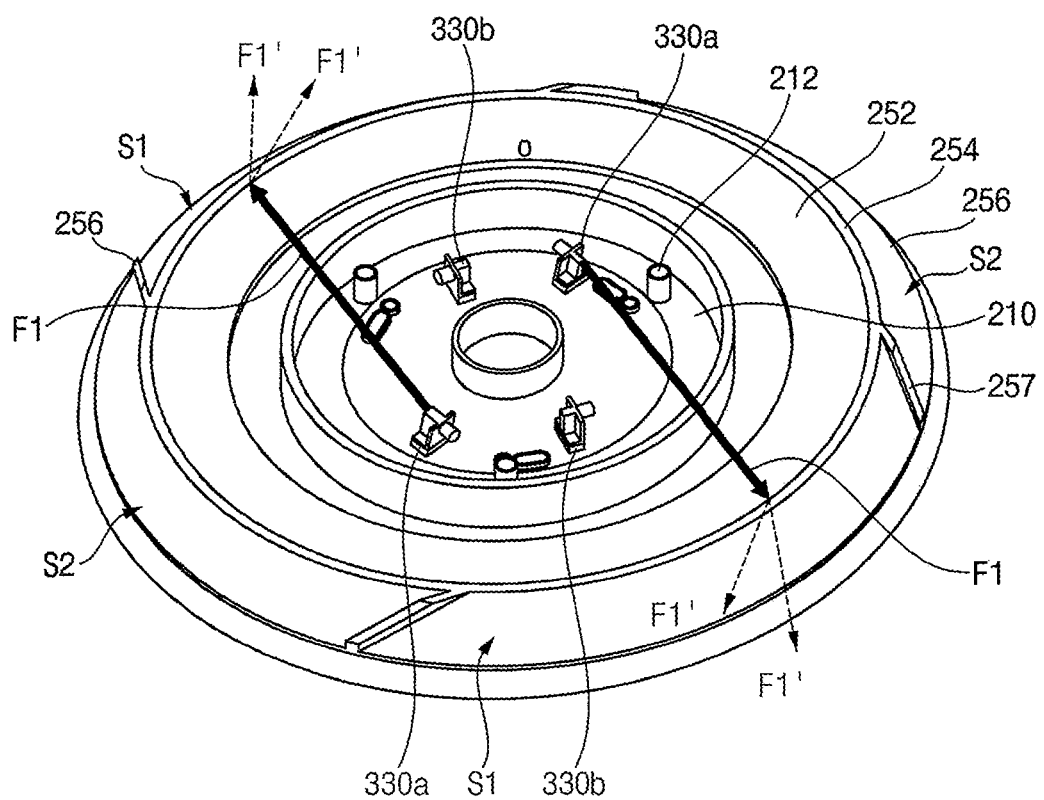

Referring to FIGS. 14 and 15, in order to firstly clean the wafer W on which the coating liquid has been coated, a first chemical solution having a first physical property may be sprayed on the upper and lower surfaces of the wafer W.

In example embodiments, in the lowered position (i.e., the first position) where the discharge separation plate 260 is lowered, the first upper cleaning nozzle 320a and the first lower cleaning nozzles 330a may spray the first chemical solution on the upper and lower surfaces of wafer W, respectively. The first upper cleaning nozzle 320a may spray the first chemical solution onto an edge region of the upper surface of the wafer W. The two first lower cleaning nozzles 330a may spray the first chemical solution F1 in a first direction and in a direction opposite to the first direction, respectively. For example, the first chemical solution may include an organic solvent. The first chemical solution scattered from the upper and lower surfaces of the wafer W may be collected in the first collection portion 224a along the first discharge path P1 and then may be discharged through the first discharge line 226a.

The first chemical solution F1' sprayed from the first lower cleaning nozzles 330a and scattered from the lower surface of the wafer W may be guided to be discharged into the accommodating space 202 along first guide passages S1 of the discharge guide plate 250. Then, the first chemical solution F1' may be collected in the first collection portion 224a along the first discharge path P1 between the outer surface of the discharge separation plate 260 and the inner surface of the inner sidewall 220a and then may be discharged through the first discharge line 226a.

Figure 16:
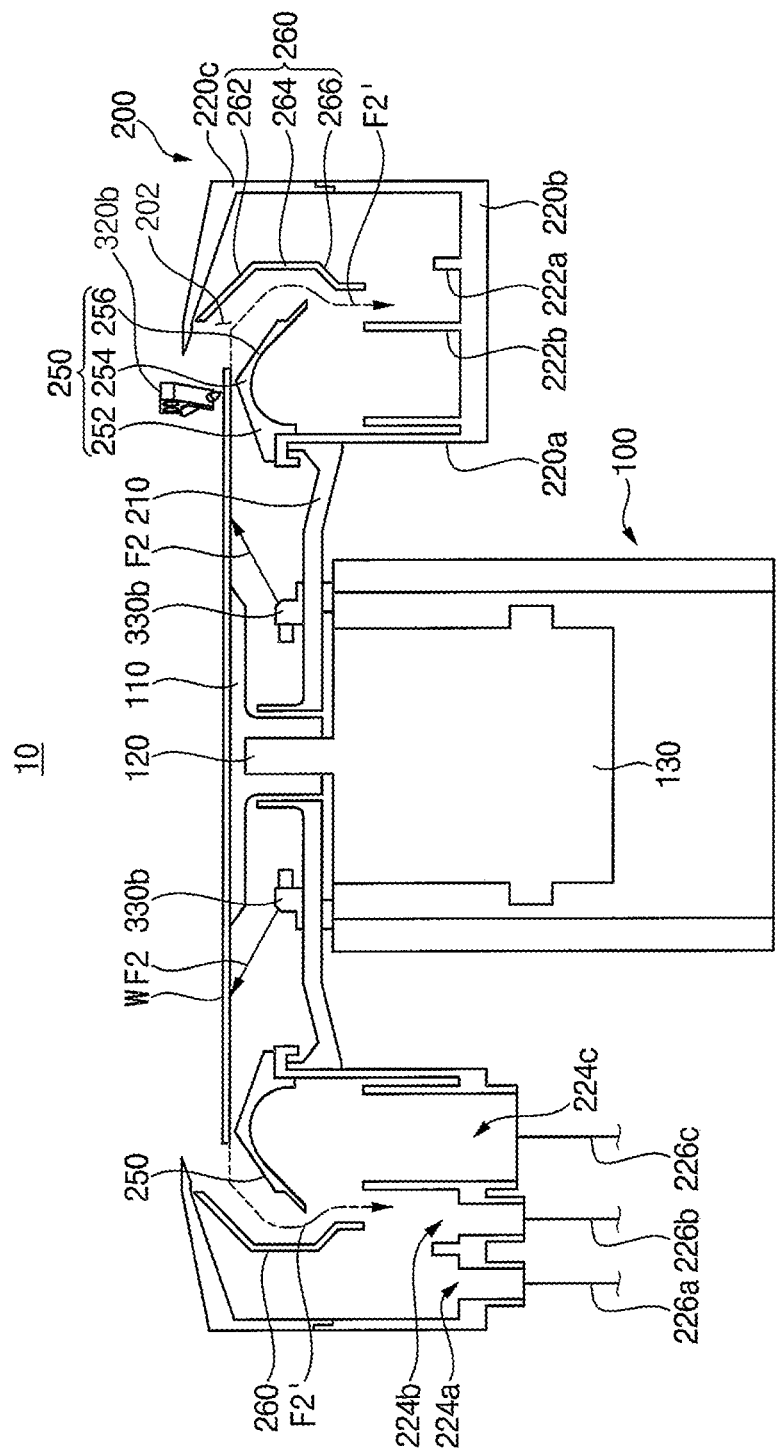
Figure 17:
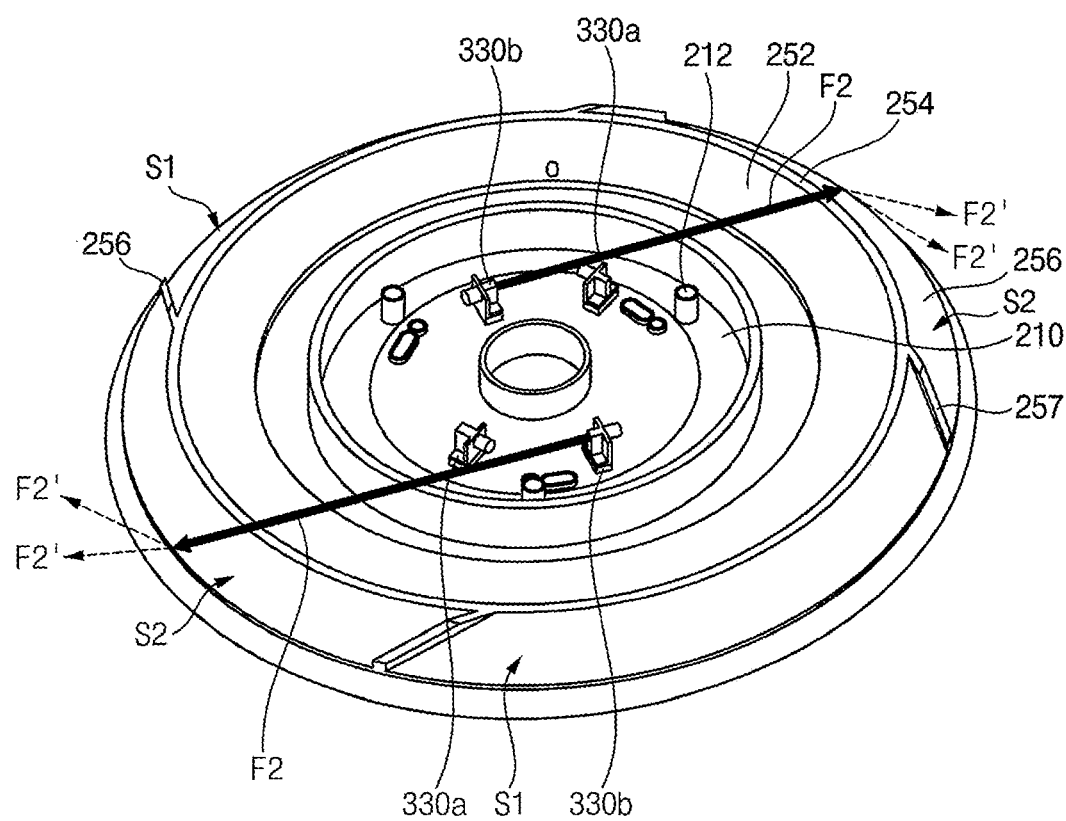

Referring to FIGS. 16 and 17, in order to secondly clean the wafer W on which the coating solution has been coated, a second chemical solution having a second physical property may be sprayed on the upper and lower surfaces of the wafer W.

In example embodiments, the discharge separation plate 260 may move to an elevated position (i.e., the second position), and the second upper cleaning nozzle 320b and the second lower cleaning nozzles 330b may spray the second chemical solution onto the upper and lower surfaces of the wafer W, respectively. The second upper cleaning nozzle 320b may spray the second chemical solution onto the edge region of the upper surface of the wafer W. The two second lower cleaning nozzles 330b may spray the second chemical solution F2 in a second direction and in a direction opposite to the second direction, respectively. For example, the second chemical solution may include an acidic aqueous solution. The second chemical solution scattered from the upper and lower surfaces of the wafer W may be collected in the second collection portion 224b along the second discharge path P2 between an inner surface of the discharge separation plate 260 and an outer surface of the discharge guide plate 250 and then may be discharged through the second discharge line 226b.

The second chemical solution F2' sprayed from the second lower cleaning nozzles 330b and scattered from the lower surface of the wafer W may be guided to be discharged into the accommodating space 202 along the second guide passages S2 of the discharge guide plate 250. Then, the second chemical solution F2' may be collected in the second collection portion 224b along the second discharge path P2 and then may be discharged through the second discharge line 226b.

As described above, in order to remove the edge beads remaining in the edge region of the wafer after spraying the coating solution (or the developer) onto the wafer, the first chemical solution having the first physical property may be sprayed on the upper and lower surfaces of the wafer, respectively, to perform a first cleaning, and the second chemical solution having the second physical property different from the first physical property may be sprayed on the upper and lower surfaces of the wafer, respectively, to perform a second (i.e., secondary) cleaning.

When the discharge separation plate 260 is in the lowered position (i.e., the first position), the first chemical solution scattered from the wafer W during the first cleaning may be collected in the first collection portion 224a along the first discharge path P1. When the discharge separation plate 260 is in the raised position (i.e., the second position), the second chemical solution scattered from the wafer W during the secondary cleaning may be collected in the second collection portion 224b along the second discharge path P2.

Accordingly, chemical solutions having different properties during the first cleaning and the second cleaning may be separately recovered through different discharge paths using the discharge guide plate 250 and the discharge separation plate 260 in the multi-stage bowl structure. Thus, chemical solutions having different physical properties may be collected through different paths and be recovered through different discharge paths without mixing.

Further, through the different surface properties of the discharge guide plate and the discharge separation plate, each chemical solution may be discharged quickly and smoothly without wetting the surfaces of the plates, to thereby omit an additional drying process between the first cleaning and the secondary cleaning. Accordingly, the process time may be reduced and thus overall productivity may be improved.

Since different chemical solutions are recovered separately from each other, the amount of consumed solvent may be minimized. In addition, the complex configuration of the bowl assembly may be simplified to make the form factor of the equipment compact, and several modules (e.g., spin coaters, developing devices) may be installed together in a limited space, to thereby improve overall productivity.

Semiconductor devices manufactured by the above-described substrate processing apparatus and substrate processing method may include a semiconductor element, e.g., a logic element or a memory element. The semiconductor device may include logic devices, e.g., central processing units (CPUs), main processing units (MPUs), or application processors (APs), or the like, volatile memory devices, e.g., dynamic random-access memory (DRAM) devices, static random-access memory (SRAM) devices, and non-volatile memory devices, e.g., flash memory devices, phase-change random-access memory (PRAM) devices, magnetoresistive random-access memory (MRAM) devices or resistive random-access memory (ReRAM) devices.

By way of summation and review, chemical solutions used in EUV photo equipment may have different properties. However, the chemical solutions are not properly separated and discharged in the existing multi-stage bowl structure, and instead, are mixed and discharged from the existing bowl structure together.

In contrast, example embodiments provide a substrate processing apparatus capable of minimizing an amount of consumed solvent and providing a compact form factor of photo equipment. Example embodiments also provide a substrate processing method using the substrate processing apparatus.

That is, according to example embodiments, in order to clean a wafer after spraying a coating solution (or a developer) onto the wafer, a first chemical solution having a first physical property may be sprayed on upper and lower surfaces of the wafer, respectively, to perform a first cleaning, and a second chemical solution having a second physical property different from the first physical property may be sprayed on the upper and lower surfaces of the wafer, respectively, to perform a second cleaning.

A substrate processing apparatus, according to example embodiments, may include a discharge guide plate extending outwardly from a circumference of the wafer under the wafer within an accommodating space of a multi-stage bowl structure having an annular ring shape so as to surround a substrate support and a discharge separation plate movable upward and downward within the accommodating space. When the discharge separation plate is in a lowered position (first position), the first chemical solution scattered from the wafer during the first cleaning may be collected in a first collection portion along a first discharge path. When the discharge separation plate is in a raised position (second position), the second chemical solution scattered from the wafer during the second cleaning may be collected in a second collection portion along a second discharge path.

Accordingly, chemical solutions having different properties during the first cleaning and the second cleaning may be separately recovered through different discharge paths using the discharge guide plate and the discharge separation plate in the multi-stage bowl structure. Thus, chemical solutions having different physical properties may be collected through different paths and be recovered through different discharge paths without mixing with each other. Further, through different surface properties of the discharge guide plate and the discharge separation plate, each chemical solution may be discharged quickly and smoothly without wetting the surfaces of the plates, to thereby omit an additional drying process between the first cleaning and the second cleaning. Accordingly, the process time may be reduced and thus overall productivity may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising:
  a substrate support to support and rotate a substrate;
  at least one first lower cleaning nozzle on the substrate support, the at least one first lower cleaning nozzle being configured to spray a first cleaning liquid having a first physical property onto a lower surface of the substrate;
  at least one second lower cleaning nozzle on the substrate support, the at least one second lower cleaning nozzle being configured to spray a second cleaning liquid having a second physical property different from the first physical property onto the lower surface of the substrate;
  a bowl assembly around the substrate support, the bowl assembly including:
    an annular shaped receiving space surrounding the substrate support, the annular shaped receiving space to accommodate a chemical solution scattered from the substrate, and
    an inner collection portion and an outer collection portion sequentially arranged in a radial direction in a lower portion of the annular shaped receiving space;
  a discharge guide plate having an annular shape, the discharge guide plate being in the receiving space of the bowl assembly under the substrate, and the discharge guide plate extending outwardly from a circumference of the substrate; and
  a discharge separation plate within the receiving space of the bowl assembly, the discharge separation plate being movable upward and downward relative to the discharge guide plate, respectively,
  wherein the discharge guide plate includes:
    an upwardly inclined plate extending from an upper portion of the inner sidewall away from the substrate support,
    a top portion extending from the upwardly inclined plate,
    a downwardly inclined plate extending from the top portion away from the substrate support, and
    partition walls extending along an upper surface of the downwardly inclined plate, each of the partition walls extending from the top portion to a bottom edge of the downwardly inclined plate at an oblique angle with respect to the bottom edge,
  wherein, when the discharge separation plate is in a lowered position, the discharge separation plate and the discharge guide plate together define a first discharge path through which the first cleaning liquid scattered from the substrate is collected in the outer collection portion, and
  wherein, when the discharge separation plate is in a raised position, the discharge separation plate and the discharge guide plate together define a second discharge path through which the second cleaning liquid scattered from the substrate is collected in the inner collection portion.

2. The substrate processing apparatus as claimed in claim 1, wherein the bowl assembly includes:
  an inner sidewall, a lower wall, and an outer sidewall defining the receiving space, the receiving space having an open top; and
  a first sidewall on the lower wall and extending into the receiving space, the first sidewall extending along an extending direction of the lower wall to define the inner collection portion and the outer collection portion.

3. The substrate processing apparatus as claimed in claim 1, wherein the partition walls of the discharge guide plate are in direct contact with the top portion and the upper surface of the downwardly inclined plate, the upper surface of the downwardly inclined plate having first and second guide passages separated by the partition walls.

4. The substrate processing apparatus as claimed in claim 3, wherein:
  the upper surface of the downwardly inclined plate is separated by the partition walls into a first surface and a second surface that alternate along a circumference of the downwardly inclined plate,
  the first surface of the downwardly inclined plate defines the first guide passage and has a hydrophilic surface roughness, and
  the second surface of the downwardly inclined plate defines the second guide passage and has a hydrophobic surface roughness.

5. The substrate processing apparatus as claimed in claim 3, wherein the at least one first lower cleaning nozzle is configured to spray the first cleaning liquid toward the first guide passage, and the at least one second lower cleaning nozzle is configured to spray the second cleaning liquid toward the second guide passage.

6. The substrate processing apparatus as claimed in claim 1, further comprising:
- at least one first upper cleaning nozzle above the bowl assembly, the at least one first upper cleaning nozzle being configured to spray the first cleaning liquid toward an edge region of an upper surface of the substrate; and
- at least one second upper cleaning nozzle above the bowl assembly, the at least one second upper cleaning nozzle being configured to spray the second cleaning liquid toward the edge region of the upper surface of the substrate.

7. The substrate processing apparatus as claimed in claim 1, further comprising a treatment liquid spray nozzle above the bowl assembly, the treatment liquid spray nozzle being configured to spray a treatment liquid on an upper surface of the substrate.

8. The substrate processing apparatus as claimed in claim 1, wherein an outer surface of the discharge separation plate facing the substrate support has a hydrophilic surface roughness, and an inner surface of the discharge separation plate opposite to the outer surface has a hydrophobic surface roughness.

9. The substrate processing apparatus as claimed in claim 8, wherein the first cleaning liquid includes an organic solvent and the second cleaning liquid includes an acidic or basic aqueous solution.

10. A substrate processing apparatus, comprising:
- a substrate support to support and rotate a substrate;
- a treatment liquid spray nozzle configured to spray a treatment liquid on an upper surface of the substrate;
- at least one first upper cleaning nozzle configured to spray a first cleaning liquid toward an edge region of the upper surface of the substrate;
- at least one second upper cleaning nozzle configured to spray a second cleaning liquid toward the edge region of the upper surface of the substrate;
- at least one first lower cleaning nozzle on the substrate support and configured to spray the first cleaning liquid on a lower surface of the substrate;
- at least one second lower cleaning nozzle on the substrate support and configured to spray the second cleaning liquid on the lower surface of the substrate;
- a bowl assembly around the substrate support, the bowl assembly including:
- an annular shaped receiving space surrounding the substrate support, the annular shaped receiving space to accommodate a chemical solution scattered from the substrate, and
- an inner collection portion and an outer collection portion sequentially arranged in a radial direction in a lower portion of the annular shaped receiving space;
- a discharge guide plate having an annular shape, the discharge guide plate being in the receiving space of the bowl assembly under the substrate, and the discharge guide plate extending outwardly from a circumference of the substrate; and
- a discharge separation plate within the receiving space of the bowl assembly, the discharge separation plate being movable upward and downward relative to the discharge guide plate, respectively,
- wherein the discharge guide plate includes:
  - an upwardly inclined plate extending from an upper portion of the inner sidewall away from the substrate support,
  - a top portion extending from the upwardly inclined plate,
  - a downwardly inclined plate extending from the top portion away from the substrate support, and
  - partition walls extending along an upper surface of the downwardly inclined plate, each of the partition walls extending from the top portion to a bottom edge of the downwardly inclined plate at an oblique angle with respect to the bottom edge,
- wherein, when the discharge separation plate is in a first position, the discharge separation plate and the discharge guide plate together define a first discharge path through which the first cleaning liquid scattered from the substrate is collected in the outer collection portion, and
- wherein, when the discharge separation plate is in a second position, the discharge separation plate and the discharge guide plate together define a second discharge path through which the second cleaning liquid scattered from the substrate is collected in the inner collection portion.

11. The substrate processing apparatus as claimed in claim 10, wherein the bowl assembly includes a cup body providing the receiving space, and the inner collection portion and the outer collection portion are sequentially arranged in the radial direction in a lower portion of the cup body.

12. The substrate processing apparatus as claimed in claim 10, wherein the bowl assembly includes:
- an inner sidewall, a lower wall, and an outer sidewall defining the receiving space, the receiving space having an open top; and
- a first sidewall on the lower wall and extending into the receiving space, the first sidewall extending along an extending direction of the lower wall to define the inner collection portion and the outer collection portion.

13. The substrate processing apparatus as claimed in claim 10, wherein, when the discharge separation plate is in the first position:
- an upper end portion of the discharge separation plate comes into contact with a lower end portion of the downwardly inclined plate, and
- the first discharge path is defined between an outer surface of the discharge separation plate and an inner surface of the inner sidewall.

14. The substrate processing apparatus as claimed in claim 13, wherein, when the discharge separation plate is in the second position:
- the upper end portion of the discharge separation plate is spaced from the downwardly inclined plate, and
- the second discharge path is defined between an outer surface of the discharge guide plate and an inner surface of the discharge separation plate.

15. The substrate processing apparatus as claimed in claim 10, wherein the upper surface of the downwardly inclined plate has first and second guide passages separated by the partition walls.

16. The substrate processing apparatus as claimed in claim 15, wherein a first surface of the downwardly inclined plate providing the first guide passage has a hydrophilic surface roughness, and a second surface of the downwardly inclined plate providing the second guide passage has a hydrophobic surface roughness.

17. The substrate processing apparatus as claimed in claim 10, wherein the treatment liquid includes a photoresist containing metal.

18. The substrate processing apparatus as claimed in claim 10, wherein the first cleaning liquid includes an organic solvent, and the second cleaning liquid includes an acidic or basic aqueous solution.

19. The substrate processing apparatus as claimed in claim 1, wherein the partition walls are spaced apart from each other along a circumferential direction of the downwardly inclined plate, each of the partition walls having a predetermined thickness from the upper surface of the downwardly inclined plate.

20. The substrate processing apparatus as claimed in claim 2, wherein the bowl assembly further includes a second sidewall on the lower wall and extending into the receiving space, the second sidewall extending between and spaced apart from each of the first sidewall and the inner sidewall, and the downwardly inclined plate of the discharge guide plate extending beyond and covering a top of the second sidewall.

* * * * *